United States Patent [19]
Mito

[11] Patent Number: 4,794,618
[45] Date of Patent: Dec. 27, 1988

[54] DISTRIBUTED FEEDBACK LASER DIODE
[75] Inventor: Ikuo Mito, Tokyo, Japan
[73] Assignee: NEC Corporation, Tokyo, Japan
[21] Appl. No.: 76,812
[22] Filed: Jul. 23, 1987
[30] Foreign Application Priority Data
  Jul. 25, 1986 [JP] Japan .................... 61-176016
[51] Int. Cl.⁴ .................... H01S 3/08; H01S 3/19
[52] U.S. Cl. .................... 372/96; 372/45; 372/48; 372/49; 372/102
[58] Field of Search .............. 372/96, 45, 46, 48, 372/49, 102

[56] References Cited
U.S. PATENT DOCUMENTS
4,701,930 10/1987 Akiba et al. .................... 372/96

FOREIGN PATENT DOCUMENTS
0139486 8/1983 Japan .................... 372/48

OTHER PUBLICATIONS
Utaka et al., "Analysis of Quarter-Wave Shifted DFB Laser", Electronics Letters, Apr. 12, 1984, vol. 20, No. 8, pp. 326-327.
Characteristics of Quarter-Wave Shifted DFB Laser Diode (No. 1017), The Institute of Electronics and Communication Engineers of Japan, 3/26 to 28/84, pp. 49-56.
Fabrication of 1.5 um Phase-Shifted DFB Lasers (No. 1018), The Institute of Electronics and Communications Engineers of Japan, Mar. 26 to 28, 1984, pp. 4-71-4.72.

Primary Examiner—William L. Sikes
Assistant Examiner—Georgia Y. Epps
Attorney, Agent, or Firm—Sughrue, Mion, Zinn, Macpeak & Seas

[57] ABSTRACT

An improved distributed feedback laser diode comprises a diffraction grating in a resonator. The diffraction grating is formed to have a phase shift of λ/8 to 3λ/16 at a portion thereof so that the phase shift amount of approximately λ/4 is obtained in a case where a maximum rate of light output is produced thereby to result in a single axial mode oscillation.

8 Claims, 4 Drawing Sheets

DISTRIBUTED FEEDBACK LASER DIODE

FIELD OF THE INVENTION

The invention relates to a distributed feedback laser diode, and more particularly to a distributed feedback laser diode which is applicable to a light source for an optical communication, optical measurement instrument and so on.

BACKGROUND OF THE INVENTION

One of many conventional λ/4 shifted distributed feedback laser diodes is described in the reports entitled "Characteristics of Quarter-Wave Shifted DFB Laser Diode (No. 1017)" and "Fabrication of 1.5 μm Phase-Shifted DFB Lasers (No. 1018)" in "The Institute of Electronics and Communication Engineers of Japan" held on Mar. 26 to 28, 1984. The distributed feedback laser diode (simply called "DFB LD" hereinafter) comprises a buffer layer on a substrate, an active layer on the buffer layer, a cladding layer on the active layer, a cap layer on the cladding layer, a $SiO_2$ stripe on the cap layer, and anode and cathode electrodes respectively provided on the outer surfaces of the $SiO_2$ stripe and substrate wherein a diffraction grating having a λ/4 shift is formed on the substrate, and a cleaved facet is provided on an output side of the DFB LD.

In operation, a pulse oscillation is performed at a room temperature and at a threshold level of, for instance, 800 mA based upon distributed feedback. The oscillation can be observed to be a single axial mode in a spectrum of oscillation light wherein an oscillation wavelength is smoothly varied without any mode jumping.

Therefore, the DFB LD is highly expected to be utilized for light source for a high speed and long distance optical fiber communication and for an optical measurement instrument in a coherent optical system for the reason that single wavelength operation is advantageously performed therein, and the difference of oscillation threshold gains can be large between the main and sub-modes.

In the DFB LD described above, however, a fabricating yield is not obtained as high as expected in the actual fabricating process thereof. Further, a stabilized oscillation is not obtained therein as seen in such phenomena that, at the output level of more than 5 to 10 mW, a multi-axis oscillation occurs, and an axial mode jump results in spite of the construction in which λ/4 shift is actually performed in a diffraction grating as being apparent from the fact that an oscillation light spectrum inherent to a λ/4 shifted DFB LD is observed in an operation at a level less than an oscillation threshold.

SUMMARY OF THE INVENTION

Accordingly, it is an object of the invention to provide a distributed feedback laser diode in which the change of an oscillation axial mode is prevented from occurring.

It is a further object to provide a distributed feedback laser diode in which a single axial mode oscillation is obtained even at a high output level.

According to the invention, a distributed feedback laser diode comprises a diffraction grating formed in a resonator, wherein said diffraction grating has a phase shift at a portion thereof thereby resulting in a phase shift amount of λ/8 to 3λ/16 in regard to a pitch of said diffraction grating.

BRIEF DESCRIPTION OF THE DRAWINGS

The invention will be explained in more detail in accordance with following drawings wherein.

DETAILED DESCRIPTION OF THE PREFERRED EMBODIMENT

Before describing a preferred embodiment according to the invention, a further report on a conventional λ/4 shifted DFB LD will be explained.

The reason why the aforementioned multi-axis oscillation occurs, and why the axial mode jump results are considered to be based on the effect of hole burning in a resonator as described in the report No. OQE 86-7 entitled "Mode analysis of λ/4 shifted GaInAsP/InP DFB lasers considering a refractive index change due to a spatial hole burning along a laser axis" in "The Institute of Electronics and Communication Engineers of Japan" in April of 1986.

Figure 1:
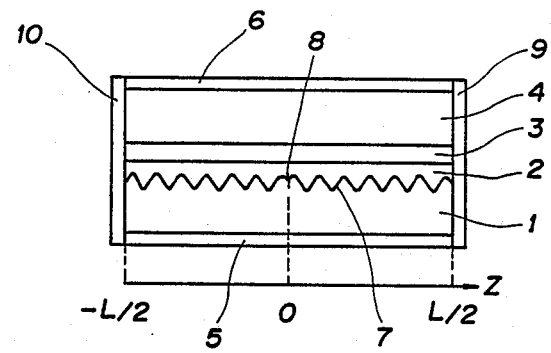
FIG. 1 is a cross sectional view illustrating a part of a conventional distributed feedback laser diode.

In FIG. 1, there is shown a resonator in a λ/4 shifted DFB LD described in that report. The resonator comprises a cladding layer 1, a guided layer 2 formed on the cladding layer 1, an active layer 3 formed on the guided layer 2, another cladding layer 4 formed on the active layer 3, and electrodes 5 and 6 provided on the respective outer surfaces of the cladding layers 1 and 4 wherein a diffraction grating 7 is formed to have a λ/4 shift 8 in the center position O thereof on the cladding layer 1, and anti-reflection coated facets 9 and 10 are provided on the both sides of the resonator. The resonator is of a length L in the direction of the axis z so that the respective ends are positioned at distances L/2 and −L/2 from the center position O.

Figure 2A:
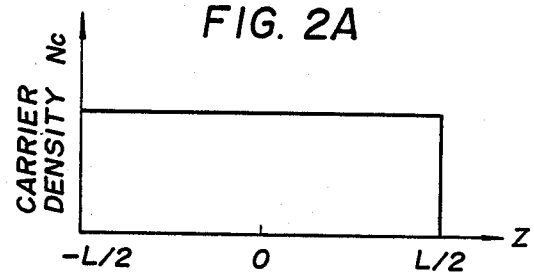
FIGS. 2A to 2D are explanatory diagrams respectively showing a carrier density, recombination carrier density, net carrier density, and refractive index in the direction of the axis z of the conventional distributed feedback diode.

In operation, current is injected with a current density $J_c$ from the electrodes 5 and 6 so that a carrier density $N_c$ is uniformly distributed in the active layer 3 from −L/2 to L/2 as shown in FIG. 2A. The carrier density $N_c$ is determined by the equation (1).

$$N_c = \tau_s J_c / e \cdot d_a \quad (1)$$

wherein $\tau_s$ is a lifetime of carrier, e is an unit electron charge, and $d_a$ is a thickness of the active layer 3.

Figure 2B:
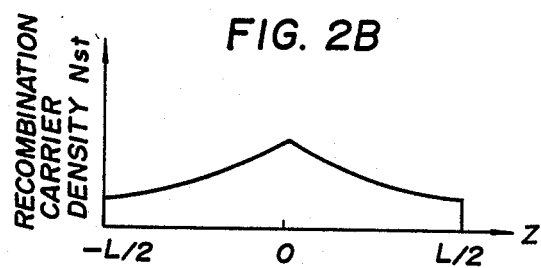

On the other hand, it is known that electric fields of light are distributed in the resonator of the λ/4 shifted DFB LD to have a maximum level at the λ/4 shift 8 and to be decreased gradually towards the direction of the both ends $-L/2$ and $L/2$. This is caused by the recombinations of electrons and holes in the active layer 3. The recombination carrier density $N_{st}$ is determined by the equation (2).

$$N_{st} = \xi hd\, sV_s g(z)p(z) \qquad (2)$$

where $\xi$ is a coefficient of confining light into the active layer 3, $V_s$ is a velocity of light in the laser diode, $g(z)$ is a gain at a position z, and $p(z)$ is a photon density at a position z. As clearly understood from the equation (2), the recombination carrier density $N_{st}$ is proportional to the photon density $p(z)$ so that the recombination carrier density $N_{st}$ is distributed as shown in FIG. 2B.

Figure 2C:
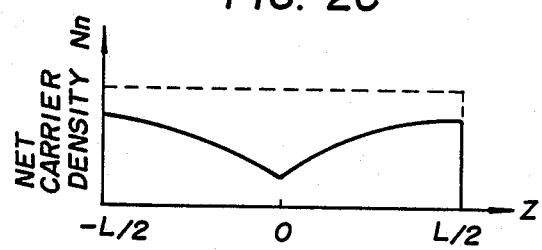

A net carrier density $N_n$ is determined in the active layer 3 by the equation (3) as shown in FIG. 2C.

$$N_n = N_c - N_{st} \qquad (3)$$

It is understood in FIG. 2C that the net carrier density $N_n$ is not flat in the axial direction of the resonator, but is the lowest in the center position O whereby a refractive index $N_a$ is determined by the equation (4).

$$N_a = N_{ao} + (dn/dN)N_n(z) \qquad (4)$$

where $N_{ao}$ is a refractive index before current is injected.

Figure 2D:
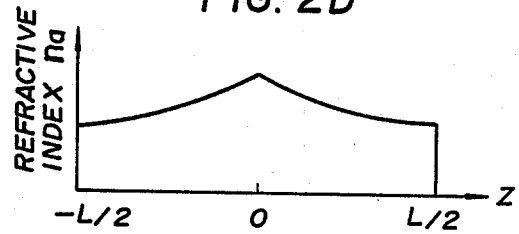

The differential value $(dn/dN)$ of refractive index n depending upon carrier density $N_n(z)$ has been obtained by measuring a wavelength shift in a laser diode of the InGaAsP/InP system. For instance, the value $(dn/dN)$ is $-(2.8\pm 0.6)\times 10^{-20}$ cm$^{-3}$ at a wavelength of 1.3 μm. In general, the value $(dn/dN)$ is of negative value so that a region lower in its carrier density than ambient regions is of higher in its refractive index than the ambient regions. Therefore, the refractive index $N_a$ is distributed in the direction z of the resonator as shown in FIG. 2D. As clearly understood therefrom, the refractive index $N_a$ is the highest in the center position O corresponding to the $\lambda/4$ shift 8 and is gradually decreased towards the both ends $-L/2$ and $L/2$. This means that optical pitches of the diffraction grating 7 are different in the resonator. Such a phenomenon as described above is more emphasized depending upon the increase of light output from the resonator. As a result, a multimode oscillation tends to occur for the reason that the difference of oscillation threshold gains is lowered between the main and sub-modes as described in the aforementioned report. This report concludes that it is important and necessary to provide such an electric field distribution of light that the fluctuation of the refractive index distribution is decreased, that is to say, the multiplied value KL is as low as 1.2 to 1.3 in accordance with the control of a coupling constant K between the diffraction grating and light. For this purpose, a depth of the diffraction grating is made larger. However, such a construction is considered to be equal to the construction of Fabry-Perot type of semiconductor laser diode in which a reflection coefficient is made lower at the both end planes. Consequently, there result disadvantages that an oscillation threshold is increased, and that an oscillation of a Fabry-Perot mode occurs due to the residual reflection at the both end planes. For this reasons, it is desired that a stable single axial oscillation is performed even if the multiplied value KL is as large as 1.5.

Based upon the explanations and understandings of the aforementioned report, the basic principle of the invention will be explained.

Figure 3:
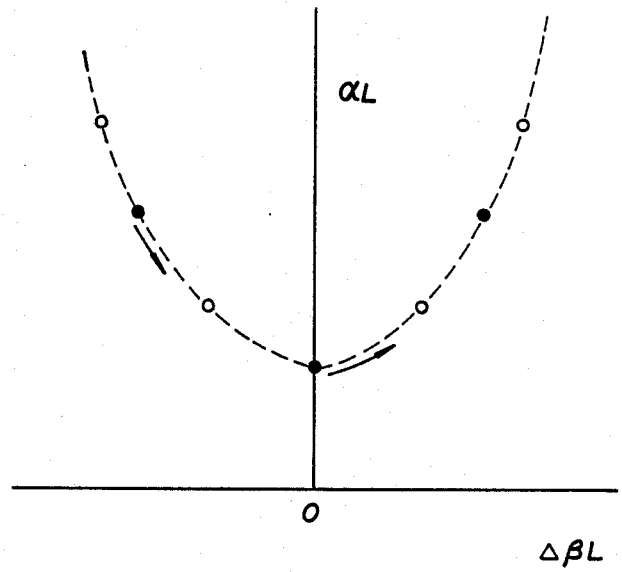
FIG. 3 is an explanatory diagram for explaining a shift of an axial mode in the conventional feedback laser diode.

In FIG. 3, there is shown a relation between a value $\Delta\beta L$ on the horizontal axis and value $\alpha L$ on the vertical axis where $\Delta\beta$ is a deviation value from a propagation constant $\beta(=2\pi n/\lambda_B)$ dependent upon a Bragg wavelength $\lambda_B$, while $\alpha$ is an oscillation threshold gain. Black points on a curve therein each corresponds to an oscillation of a normal $\lambda/4$ shift where there is no distribution of refractive index as shown in FIG. 2D. If such a distribution of refractive index as shown in FIG. 2D occurs, the position of an axial mode is varied to result in a much larger phase shift than $\lambda/4$ shift as a whole so that the position of an axial mode shifts in the right direction on the curve in FIG. 3. If the shift of the axial mode position becomes larger than a predetermined level, threshold modes are positioned on the both sides of the center Bragg wavelength $(\Delta\beta=0)$ as indicated by white points on the curve therein whereby it is considered that a multi-mode oscillation has occured.

On this premise, it is presumed that a phase shift is much larger than $\lambda/4$ in a $\lambda/4$ shifted DFB LD in a case where hole burning has occured due to the increase of light output. Therefore, it is concluded that a $\lambda/4$ shift to be formed in a resonator beforehand in regard to a pitch of a diffraction grating is too large to produce a single axial mode oscillation. According to the invention, therefore, a smaller phase shift than $\lambda/4$ is formed beforehand in a resonator so that a phase shift is adjusted to be $\lambda/4$ in a case where the light output becomes large.

Figure 4:
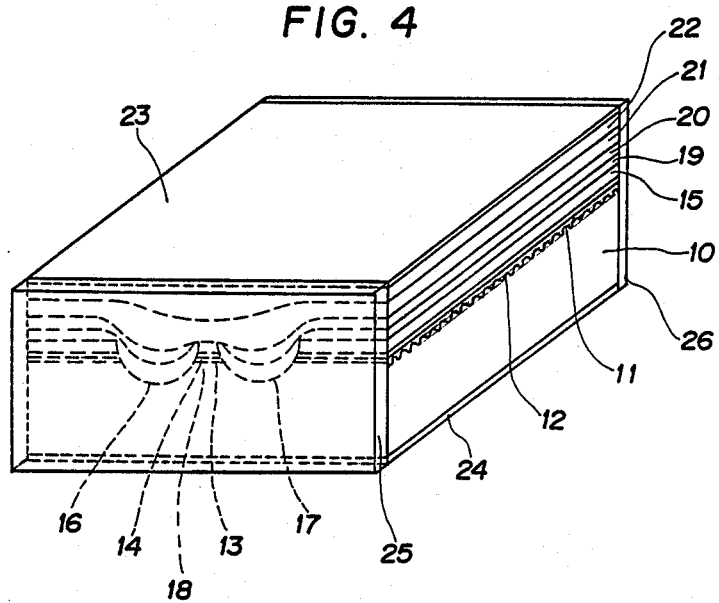
FIG. 4 is a perspective view illustrating the distributed feedback laser diode according to the invention.

In FIG. 4, there is shown a DFB LD according to the invention. The DFB LD will be fabricated as follows.

At first, a diffraction grating 11 is formed to have a phase shift 12 in the center position of a resonator on a <001> facet of an n-type InP substrate 10. The substrate 10 is doped with Sn to be of a carrier density $1\times 10^{18}$ cm$^{-3}$, and the diffraction grating 11 is of a pitch of 2400 Å. A phase shift amount is fixed to be $\lambda/8$ at the phase shift 12 in regard to the pitch of the diffraction grating 11. Next, a guided layer 13 of n-type InGaAsP, a non-doped active layer 14 of InGaAsP, and then cladding layer 15 of p-type InP are formed respectively on the substrate 10 by liquid phase epitaxial growth process. In this process, the guided layer 13 is doped with Sn to be of a carrier density $5\times 10^{17}$ cm$^{-3}$, and a thickness thereof is 0.2 μm based upon a line which is on intermediate positions between the top and bottom of the diffraction grating 11, while the active layer 14 is of a composition to be adapted to an oscillation wavelength 1.55 μm, and a thickness thereof is 0.1 μm. The cladding layer 15 is doped with Zn to be of a carrier density $2\times 10^{18}$ cm$^{-3}$, and a thickness thereof is 1 μm. Two grooves 16 and 17 are then provided in parallel so that a mesa stripe 18 is sandwiched therebetween. The active layer 14 is as wide as 1.5 to 2.0 μm in the mesa stripe 18, and each of the grooves 16 and 17 is 10 μm in its width. Thereafter, a current blocking layer 19 of p-typed InP and current confining layer 20 of n-typed InP are formed not to cover the surface of the mesa stripe 18 by liquid phase epitaxial growth process. In the process, the current blocking layer 19 is doped with Zn to be of a carrier density $2\times 10^{18}$ cm$^{-3}$, and a thickness thereof is 0.5 μm at the flat portion thereof, while the current confining layer 20 is doped with Te to be of a carrier density $5\times 10^{18}$ cm$^{-3}$, and a thickness thereof is 0.5 μm at the flat portion thereof. Further, a buried layer 21 of p-type InP and a cap layer 22 of p-typed InGaAsP are formed to cover a whole surface of the mesa stripe 18 and current confining layer 20. The buried layer 21 is doped with Zn to be of a carrier density $1 \times 10^{18} cm^{-3}$, and a thickness thereof is 1.5 μm at the flat portion thereof, while the cap layer 22 is doped with Zn to be of a carrier density $8 \times 10^{18} cm^{-3}$, and a thickness thereof is 0.5 μm at the flat portion thereof. Thereafter, the bottom surface of the substrate 10 is polished to be of 130 μm in the thickness of the whole structure, and a p-electrode 23 of Cr/Au and n-electrode 24 of Au/Ge/Ni are then provided respectively on the top surface of the cap layer 22 and bottom surface of the substrate 10 by evaporation and heat treatment process. Finally, cleaved facets are provided on the both end planes to have low reflecting films 25 and 26 on which SiNx is evaporated by plasma CVD method thereby resulting in a reflection coefficient which is as low as 0.5 to 1%. In the DFB LD thus fabricated, the coupling coefficient K is approximately $70 cm^{-1}$ between the diffraction grating 11 and light.

Figure 5:
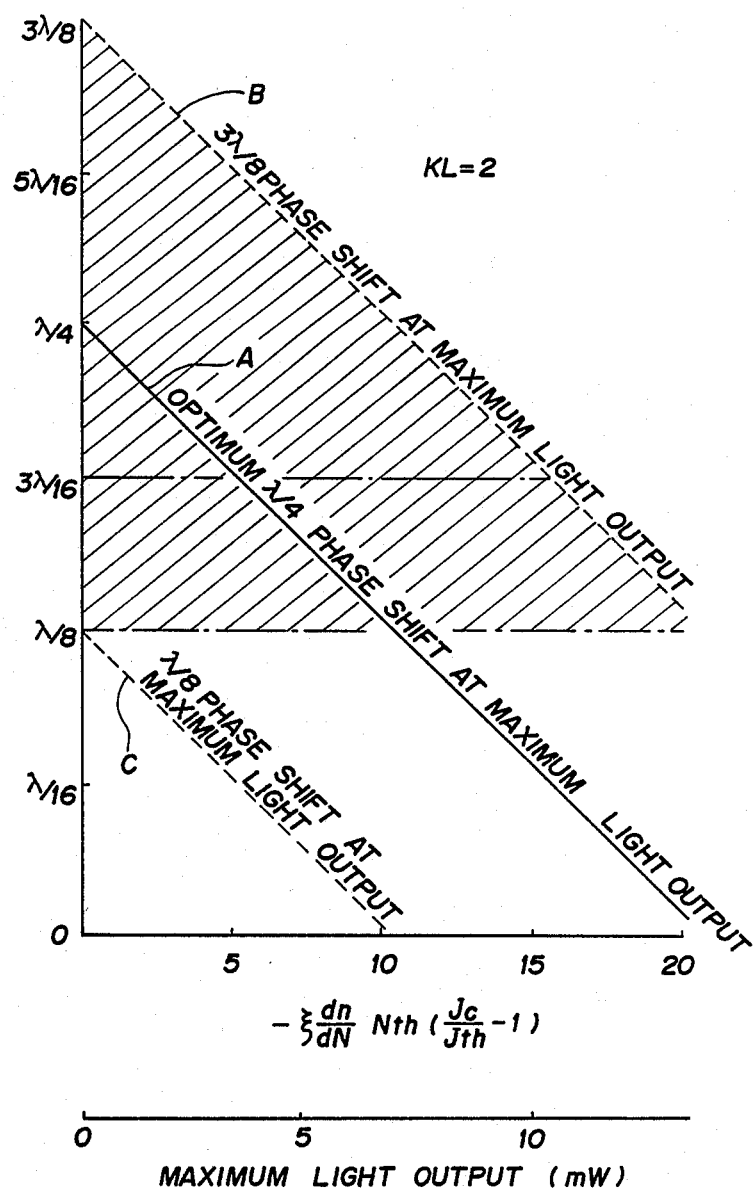
FIG. 5 is an explanatory diagram showing an optimum phase shift amount in regard to an output level in a distributed feedback laser diode according to the invention.

Next, a phase shift amount to be produced at a phase shift of a diffraction grating in a DFB LD according to the invention will be determined in FIG. 5 wherein an optimum phase shift amount is calculated in regard to an operating light output.

In the calculation therein, parameters each having a moderate value are used in a DFB LD as follows.

(1) a DFB LD is for a 1.5 μm wavelength band,
(2) an oscillation threshold is 25 mA in a characteristic of light output in regard to injected current, and
(3) an external differential efficiency is 0.15 W/A.

The calculation is performed in accordance with the aforementioned report No. OQE 86-8. In the calculation, it is further presumed that a light confining coefficient $\tau$ is 0.2, a refractive index change in regard to a carrier density (dn/dN) is $-1.2 \times 10^{-20} cm^{-3}$, a currier density $N_{th}$ at an oscillation threshold is $2 \times 10^{18} cm^{-3}$, and a value KL based upon a coupling constant K is 2 which is a sufficient large value. In the equation described along the horizontal line, $J_{th}$ is a current density at a threshold level.

As clearly shown in FIG. 5, an optimum phase shift amount is λ/4 when light output is 0 because no hole burning occurs under such a condition. It is understood that the optimum phase shift amount is decreased as shown by a slanting line A in accordance with the increase of the maximum light output. When the maximum light output is increased up to 10mW, the optimum phase shift amount is approximately λ/16.

The difference of oscillation threshold gains between the main and sub-modes can be sufficiently large in the range from λ/8 to 3λ/8, that is to say, a tolerance of λ/8 exists on the both sides of λ/4 when the light output is 0. The tolerance of the phase shift amount is shown by slanting dotted lines B and C in a case where the light output is increased. In general, the intensity modulation rate of a semiconductor laser ranges from 0 to several mW. Therefore, it is necessary that the difference of oscillation threshold gains between the main and sub-modes is sufficiently large in that range. The region in which such a requirement is met is shown by hatching. Consequently, it is decided that the optimum phase shift amount is from λ/8 to 3λ/16. Actually, the DFB LD in the embodiment according to the invention is fabricated to have a phase shift amount of λ/8 as described before so that a single axial mode oscillation is obtained without being affected by the increase of light output.

For the measuring purpose, a predetermined number of the DFB LDs illustrated in FIG. 4 are fixed to diamond heat sinks to evaluate characteristics thereof. Such results that an oscillation threshold is approximately 20 mA to 30 mA, and a differential efficiency is approximately 0.15 mw/A to 0.25 mw/A per one plane are obtained. A single axial mode oscillation is obtained in the range of light output from 0 to 10 mw among the DFB LDs of more than 90% in all of the DFB LDs. This means that a high fabricating yield is obtained in fabricating a DFB LD according to the invention. The reason why such a high fabricating yield is obtained is that a DFB LD according to the invention is fabricated to have a phase shift of λ/8, not λ/4 as in the conventional DFB LD. Even in a case where a light density is relatively low at the vicinity of an oscillation threshold so that an oscillation threshold is less than λ/4 between the main and sub-modes, the difference of oscillation threshold gains by which a single axial mode oscillation is sufficiently performed is obtained. Further, the difference of oscillation threshold gains is sufficiently larger between the main and sub-modes in the range of 5 mw to 10 mw which is a normal operating range for the reason described before in regard to FIG. 4 so that a stable single axial mode oscillation is obtained.

Although an oscillation wavelength is 1.55 μm in the embodiment according to the invention, it may be 1.3 μm if a DFB LD includes a diffraction grating having a pitch of 2300 Å, and if a guided and active layers thereof have compositions each corresponding to that wavelength. Further, although a stripe structure is adopted for a buried typed construction in the embodiment according to the invention, such stripe structures as planar stripe, Transverse Junction Stripe, Stripe Buried Heterostructure, Plano Convex Waveguide etc. may be utilized.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A distributed feedback laser diode comprising:
   a substrate;
   a planar waveguide structure including a first light confining layer, a second light confining layer and an active layer therebetween;
   a diffraction grating formed between said waveguide structure and said substrate;
   partially reflecting films formed on opposing ends of said waveguide structure;
   electrodes formed respectively below said substrate and above said waveguide structure;
   said diffraction grating having a phase shift at a portion thereof away from ends thereof producing thereby a phase shift amount of λ/8 to 3λ/16 between pitches of said diffraction grating on either side of said phase shift.

2. A distributed feedback laser diode comprising:
   a diffraction grating formed on a substrate, said diffraction grating having a phase shift at a portion thereof away from ends thereof producing thereby a phase shift amount of λ/8 to 3λ/16 between pitches of said diffraction grating on either side of said phase shift;

a guided layer formed through said diffraction grating on said substrate;
an active layer formed through said diffraction grating on said substrate;
a cladding layer formed on said active layer;
a current blocking layer formed on said cladding layer;
a buried layer formed on said current confining layer;
a cap layer formed on said buried layer;
a pair of electrodes respectively provided on outer surfaces of said substrate and cap layer; and
a pair of partially reflecting films respectively provided on both end planes of a layered structure thus fabricated on said substrate.

3. A distributed feedback laser diode according to claim 2;
wherein a pair of grooved are formed in parallel from said cladding layer to said substrate to provide a mesa stripe therebetween, said grooves being perpendicular to repeating lines of said diffraction grating.

4. A distributed feedback laser diode according to either of claims 1 and 2;
wherein an effective value of said phase shift amount of $\lambda/8$ to $3\lambda/16$ is increased to approximately $\lambda/4$ in a case where a maximum rate of light output is produced.

5. A distributed feedback laser diode according to claims 1 and 2,
wherein said phase shift is provided in the center position of said diffraction grating.

6. A distributed feedback laser diode as recited in claim 1, wherein said first light confining layer is a guide layer and said second light confining layer is a cladding layer.

7. A distributed feedback laser diode as recited in claim 6, wherein said diffraction grating is formed by an undulating surface between said guide layer and said substrate.

8. A distributed feedback laser diode as recited in claim 2, wherein said partially reflecting films has a reflection coefficient between 0.5% and 1%.

* * * * *

UNITED STATES PATENT AND TRADEMARK OFFICE
CERTIFICATE OF CORRECTION

PATENT NO. : 4,794,618

DATED : December 27, 1988

INVENTOR(S) : IKUO MITO, Tokyo, Japan

It is certified that error appears in the above-identified patent and that said Letters Patent is hereby corrected as shown below:

Column 5, line 36, delete "T" and insert --$\xi$--.

Signed and Sealed this

Twenty-ninth Day of August, 1989

Attest:

DONALD J. QUIGG

Attesting Officer         Commissioner of Patents and Trademarks